United States Patent [19]

Schott

[11] Patent Number: 5,006,741
[45] Date of Patent: Apr. 9, 1991

[54] BRUSHLESS GENERATOR WITH CONCENTRICALLY ARRANGED RECTIFIER ASSEMBLY

[75] Inventor: Edmund A. Schott, Rockford, Ill.

[73] Assignee: Sundstrand Corporation, Rockford, Ill.

[21] Appl. No.: 376,011

[22] Filed: Jul. 6, 1989

[51] Int. Cl.⁵ .................. H02K 11/00; H02M 1/00
[52] U.S. Cl. ......................... 310/68 D; 363/144; 363/145
[58] Field of Search .................. 310/68 D, 68 R; 363/141, 144, 145; 357/75, 76, 81, 82

[56] References Cited

U.S. PATENT DOCUMENTS

| | | | |
|---|---|---|---|
| 3,145,314 | 8/1964 | Becker | 310/68 R |
| 3,348,127 | 10/1967 | Petersen | 357/76 |
| 3,412,271 | 11/1968 | Hall | 310/68 R |
| 3,629,627 | 12/1971 | Dafler | 310/54 |
| 3,896,320 | 7/1975 | Moffat | 310/68 D |
| 4,221,982 | 9/1980 | Raver et al. | 310/59 |
| 4,329,603 | 5/1982 | Ballard | 310/61 |
| 4,472,649 | 9/1984 | Namba et al. | 310/68 D |
| 4,581,695 | 4/1986 | Hoppe | 310/68 D |
| 4,621,210 | 11/1986 | Krinickas, Jr. | 310/61 |

FOREIGN PATENT DOCUMENTS

| | | | |
|---|---|---|---|
| 1059113 | 6/1959 | Fed. Rep. of Germany | 310/68 D |
| 0468111 | 3/1969 | Switzerland | 310/68 D |
| 1104620 | 2/1968 | United Kingdom | 310/68 D |

Primary Examiner—Steven L. Stephan
Assistant Examiner—Clayton E. LaBalle
Attorney, Agent, or Firm—Antonelli, Terry, Stout & Kraus

[57] ABSTRACT

In a brushless generator having an exciter rotor (18) which generates an AC voltage that is rectified to provide a DC field for a main generator rotor (16), the rectifiers are mounted to revolve with the rotor and be fluid and conductively cooled to provide a dynamo operative without brushes, slip rings or commutators. The rectifier is formed by a diode assembly (24) including layers of insulating and conducting material that are mounted concentrically on the inside wall of a hollow rotor shaft (20) so that diode chips are stressed only in compression due to centrifugal forces of rotation. An input driven shaft (32) may be accommodated interiorly of the diode assembly (24) along the axis of the hollow rotor shaft (20). The dynamo electric machine may also be operated as a brushless motor.

19 Claims, 3 Drawing Sheets

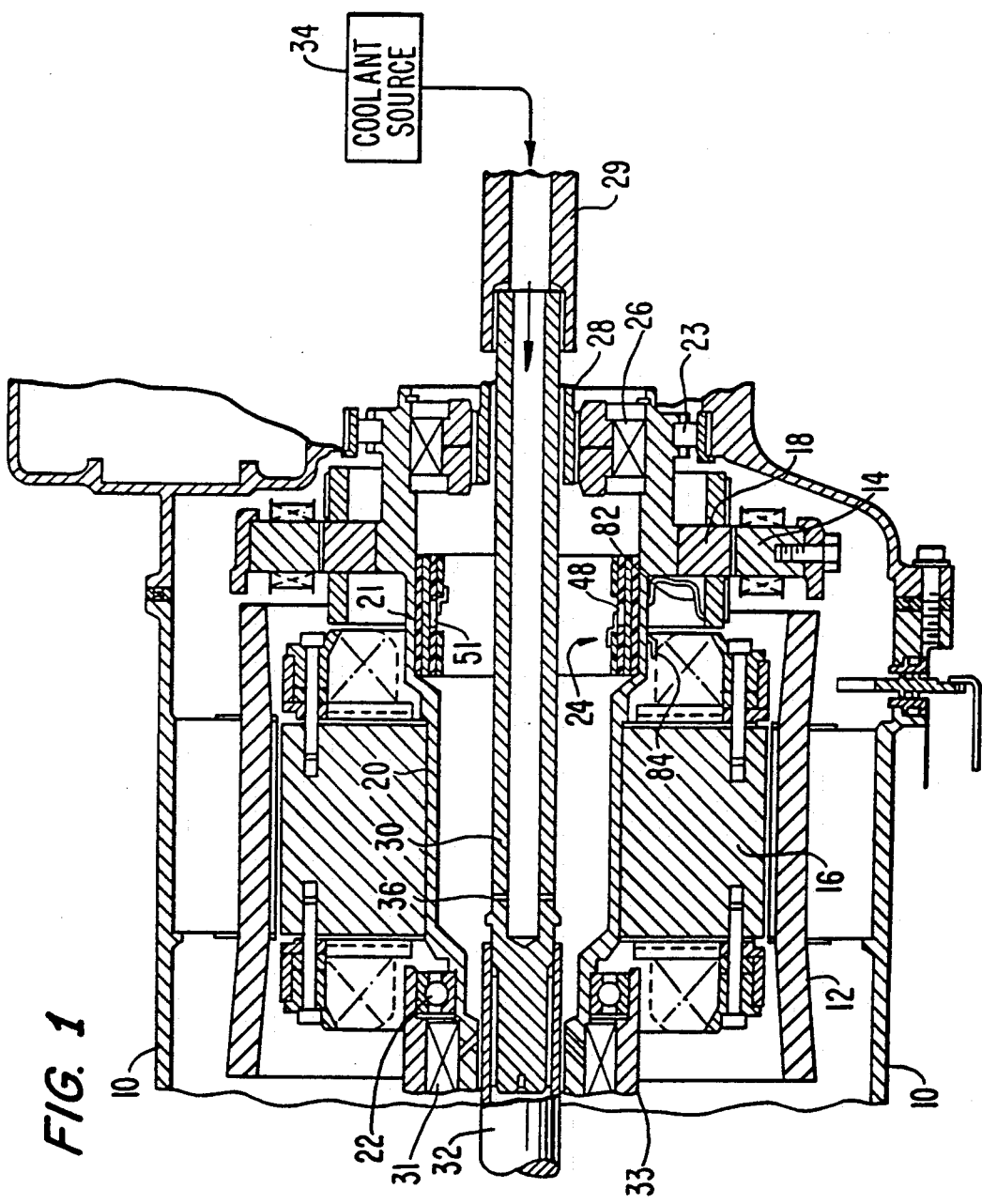

BRUSHLESS GENERATOR WITH CONCENTRICALLY ARRANGED RECTIFIER ASSEMBLY

FIELD OF THE INVENTION

This invention relates to brushless dynamo electric machines capable of use as a motor but most commonly used as a generator which has a common rotor shaft for an exciter unit and a main generator unit where the rotors are electrically interconnected by a rectifier assembly. More particularly, this invention relates to a novel rectifier assembly of diode chips installed in a hollow rotor in a manner to be hydraulically cooled with the diode chips stressed in compression due to centrifugal force.

BACKGROUND OF THE INVENTION

Brushless generators are conventionally formed of a permanent magnet generator, an exciter, and a main generator. Typically, relatively low levels of power are generated by the permanent magnet generator which is made up of a permanent magnet field carried by the generator rotor and which induces electrical energy in a stationary generator output winding. The power from this winding is rectified and subjected to known control parameters before being fed to a stationary field winding of the exciter. The exciter includes an output winding carried by the rotor and as the same rotates within the magnetic field generated by the exciter field winding, electrical energy is induced in the exciter output winding. This energy will be an alternating current and, not untypically, will be three phase alternating current.

The resulting alternating current is rectified by means of a rectifier carried within the rotor and rotating therewith as shown in U.S. Pat Nos. 4,621,210 granted Nov. 4, 1986 and 4,329,603 granted May 11, 1982. The rectified direct current is supplied to the main field winding of the main generator. The main field winding, being carried by the rotor and when energized with direct current and when rotated, provides a rotating magnetic field which in turn induces an alternating current in a stationary main armature output winding. Power thus generated may be taken from the stationary main armature output winding to a point of use by a system that is operative without need for the presence of brushes, slip rings or commutators. In aircraft power generating applications, the generators may be coupled mechanically to the aircraft engine. In the case of jet engines, the coupling is frequently in the engine gear box with the generating system being housed in the same cowling as the engine itself.

The rotating rectifier consists of individual diodes and interconnecting wiring from exciter rotor armature and to the DC main field which is mounted on the rotor shaft. During operation, the electrical losses in the rectifier diodes are dissipated as heat which must be carried away to prevent overtemperature and resulting failure of the diodes. In the prior art, stud mounted diodes have been supported on the exciter rotor hub and cooled by an oil spray while other constructions use a rectifier assembly mounted axially in the generator shaft and cooled by oil flow through the shaft with the leads to and from the rectifier passing through walls of the rotor shaft. Both of these methods of mounting and cooling have significant disadvantages and introduce problems in some instances. Some generators use conduction cooling rather than oil spray cooling to reduce viscous losses in the air gap. The spray oil cooling of the hub mounted diodes frequently results in oil in the air gap and increased viscosity losses. Likewise, the oil leaking through the holes in the shaft, through which the electrical leads pass from the rectifier assembly that is mounted axially between the rotor windings, would be thrown into the air gap causing increased viscous losses. In some designs, there is insufficient annular space for stud mounted diodes on the exciter hub. Other configurations require a drive shaft axially inside of the generator shaft making use of an axially mounted diode package impossible.

DISCLOSURE OF THE INVENTION

An object of the invention is to provide a novel diode assembly that is mounted concentrically within a hollow rotor shaft. Such a structure allows, where it is desired, an input drive shaft to be passed axially inside the hollow dynamo shaft to a mechanical device such as a constant speed drive unit. The inner shaft may be also used for another function such as engine starting.

A further object of the present invention is to provide a concentric diode package which has leads that are hydraulically sealed to holes which allow the electrical energy to be conducted to and from the rectifier unit. The hydraulic sealing means may include an eyelet terminal, a conductive bushing and an insulating bushing which are clamped to the hollow rotor shaft wall with a fastener braised or soldered to an AC conductor coming from the exciter rotor. Similar sealing and connections may be made to the DC main generator field windings. A plurality of diode fusion chips rectify the AC current and each passes the current to one of two DC conductors, one being positive and the other being negative. From the DC conductors, the current passes through a conductive bushing and into the DC field winding which is mounted on the rotor of the main generator.

The rectifier assembly may be a full wave polyphase bridge, a full wave single phase bridge or a half wave polyphase bridge. The assembly of diodes which form the rectifier are adapted to be cooled by conduction by means of oil flowing within the hollow rotor shaft and by conduction to the shaft itself.

A further object of the invention is to provide a rectifier assembly of diode chips mounted so that they are stressed only in compression due to the centrifugal forces of rotation. This compressive stress will not cause the parts, which are assembled as laminates, to separate as tensile forces would.

These and other objects of the invention will become apparent from the claims, and from the description as it proceeds in connection with the appended drawings.

BRIEF DESCRIPTION OF THE DRAWINGS

FIG. 1 is a longitudinal view in section of a brushless generator incorporating the semiconductor diode chip assembly concentrically disposed along an inner wall of the hollow rotor shaft in accordance with the present invention;

BEST MODE OF CARRYING OUT THE INVENTION

Figure 3:
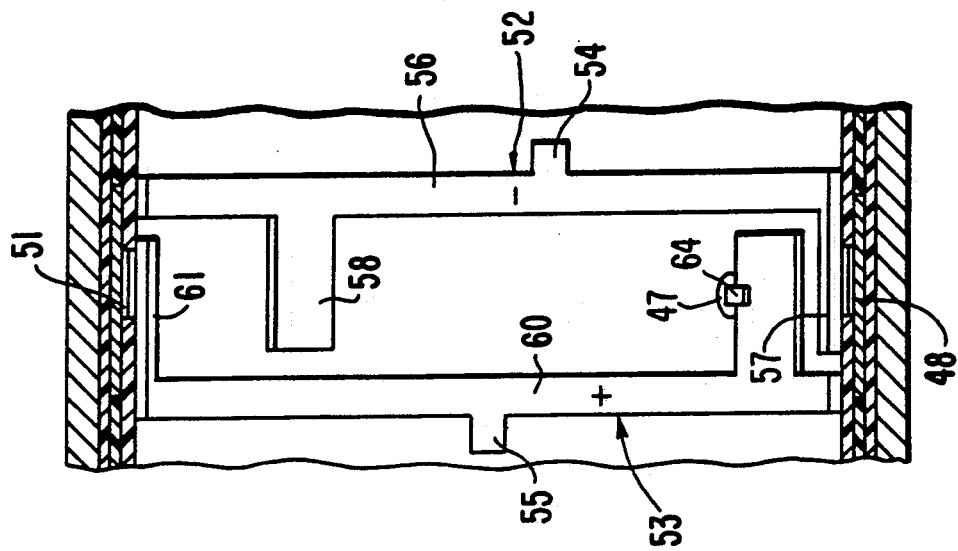
FIG. 3 is a view in section of the hollow rotor shaft and diode assembly taken along line 3—3 of FIG. 2.

Referring to FIG. 1, the housing 10 includes a main generator stator structure 12 and a smaller exciter stator structure 14 which surround the rotating structures. A rotating DC field is produced by the main generator rotor structure 16. The exciter rotor structure 18 rotates within the DC field produced by the exciter stator 14. A common rotor shaft 20 is mounted in suitable bearings 22, 23 shown in FIG. 1. The rotor shaft 20 is hollow and may have an enlarged diameter at the exciter region 21 where the diode assembly of the rectifier is located. Drive torque to the rotor may be supplied by an overrunning clutch 26 driven by the output shaft 28 of constant speed drive, not shown, which in turn may have an input shaft 29 driven by the output from a concentric inner drive shaft 30.

The constant speed drive may advantageously be of a type producing a constant speed output as is common in brushless generators used in aircraft. The inner drive shaft 30 may be spline connected to an engine driven drive shaft 32.

The generator may also function as a motor for engine starting, drive torque being transmitted through overrunning clutch 31, to shaft 33. Shaft 33 also serves as a support for bearing 22.

For use as a motor, electrical energy is supplied to the generator output terminals. Where a synchronous machine is used, a starter unit including an inverter with a variable frequency output is advantageously used.

The inner drive shaft 30 may be hollow and connected to a coolant source 34. Coolant is delivered through passageways 36 and caused to circulate, as is conventional, to have a heat exchange relationship with the diode assembly 24 as well as with other parts of the generator unit.

The diode assembly 24 (FIG. 1) as illustrated in FIGS. 2 through 6 may be formed of a plurality of concentric overlapping cylindrical layers of insulation and conductive material. The assembly includes an outer layer 38 of insulating material that is adhered to the inner surface of the steel rotor shaft 20 to electrically isolate the rectifier unit from the rotor shaft. Layer 38 may be a sleeve of flexible sheet electrical insulation or polyamide material.

On the inner surface of insulation layer 38 is a concentric layer of conductive material that is divided electrically into separate segments so that voltages that vary in phase or polarity may be accommodated. In the illustrated embodiment, the terminal leads of a three phase voltage from the exciter rotor may be supplied to the three segments 40, 41, 42 of this conductive layer. Alternatively, only two segments would be used if a single phase AC voltage is supplied by the exciter rotor.

A second concentric layer of insulation material 44 may be provided on the inner surface of layer segments 40, 41, 42. Suitable openings in layer 44 are provided to receive diode fusion chips 46–51 which have a cathode surface on one side and an anode surface on the other side.

Figure 2:
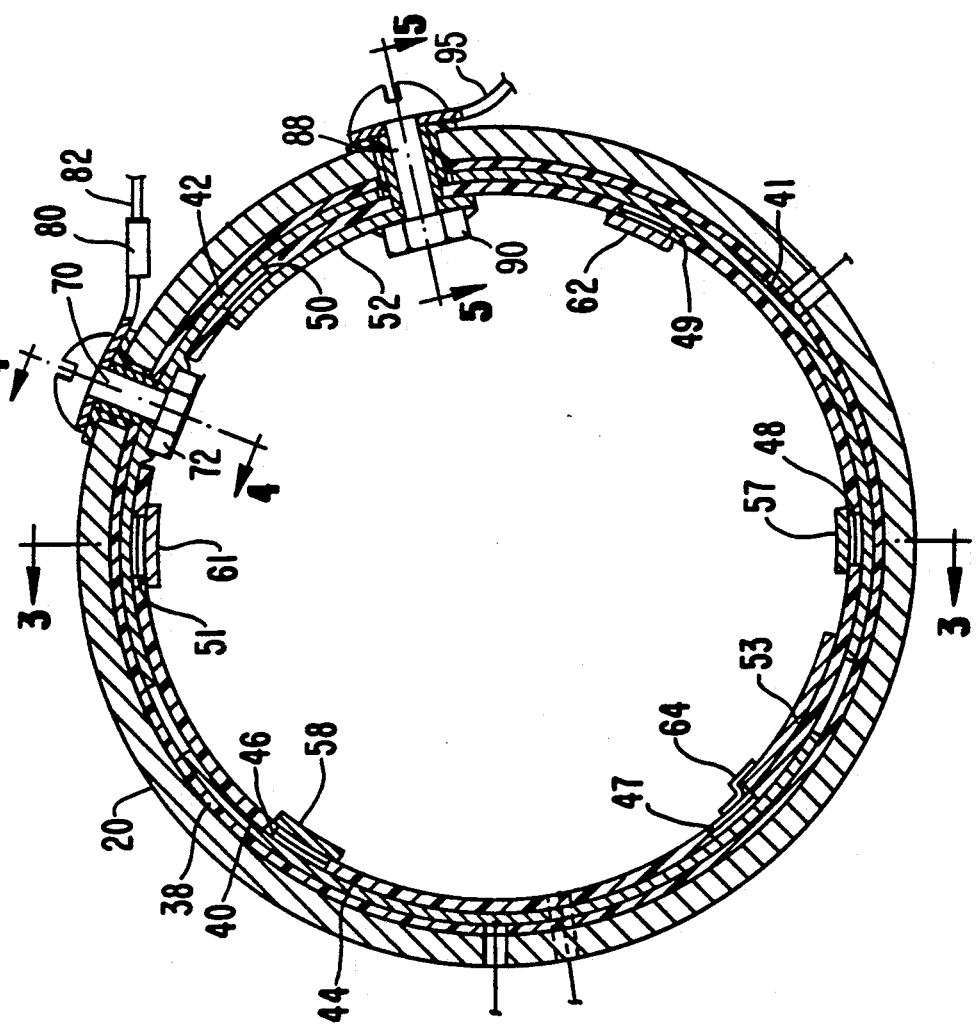
FIG. 2 is an end view in section to an enlarged scale of a diode assembly similar to that shown in FIG. 1 and of the supporting hollow rotor shaft to illustrate a typical construction of diode chip connections and connections to generator windings.
Figure 6:
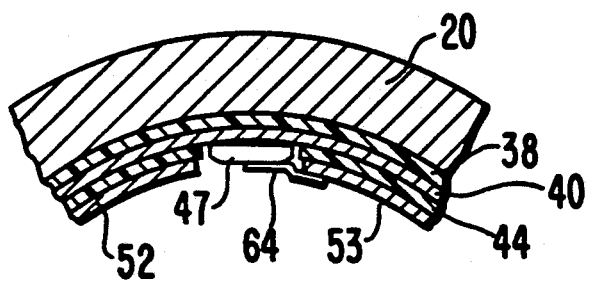
FIG. 6 is a detailed view of the construction of the rectifier assembly positioned on an inner hollow wall of a rotor shaft.

A second layer of conductive material may be provided on the exposed surface of the insulative layer 44. The second layer may be composed of two layer segments 52, 53. Layer segments 52, 53 as illustrated in FIGS. 2, 3 and 6 serve as the positive and negative voltage terminals of the rectifier unit formed by the diode assembly 24. The diodes may be connected to provide either a full wave rectifier as illustrated or a half wave rectifier where desired.

Segment 52 that is part of the circuit to the negative terminal 54 may be formed as part of a strip 56 also having tabs 57, 58 shown in FIGS. 2 and 3 which serve as terminals engaging an exposed anode surface of the diode fusion chips 46, 48 and 50. The cathode surfaces of diode chips 46, 48 and 50 are engaged with conductive layer segments 40, 41 and 42 respectively.

Segment 53 that is part of the circuit to the positive terminal 55, which is part of the DC connection to the main generator field and which may include a nut to be structurally the same as the positive terminal 54, may also be formed as a strip 60 with tabs 61, 62 serving as terminals engaging an exposed cathode surface of diode fusion chips 47, 49 and 51. The anode surfaces of the diode chips 47, 49 and 51 are engaged with conductive layer segments 40, 41 and 42 respectively.

Instead of the use of tabs at each of the diode chips, an alternative connection may be with use of a jumper or flexible lead as shown at 64 in FIGS. 2 and 6.

Figure 4:
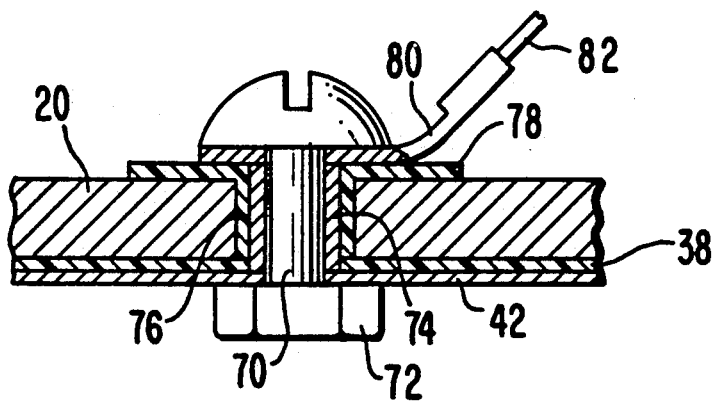
FIG. 4 is a view of a connection between the rectifier and a wire to the armature of the exciter taken along line 4—4 of FIG. 2.

It is advantageous to provide a hydraulic seal to prevent leakage of coolant from the interior of the rotor shaft 20 at the locations where the electrical connections are made to the diode assembly 24. With reference to FIGS. 2 and 4, a screw 70 is shown to extend through an aperture in rotor shaft 20 and to be held in place by nut 72 that may be secured to the first layer segment 42 of conductive material as by brazing. A conductive bushing in the form of a sleeve 74 of conductive material surrounds the screw and is in contacting relationship with the layer segment 42.

Surrounding sleeve 74 is an insulating bushing composed of sleeve 76 and a member having an enlarged diameter such as a washer or the illustrated integral flange 78, which protect the eyelet terminal 80 and the conductive sleeve 74 from contacting the rotor shaft 20. The wire 82 is connected to a lead from the armature of the exciter. Identical connections may be made from segments 40 and 41 where a three phase winding is used; if a single phase armature winding is used, only two such connections would be needed and the number and geometry of the diodes would be alternated in a logical manner.

Figure 5:
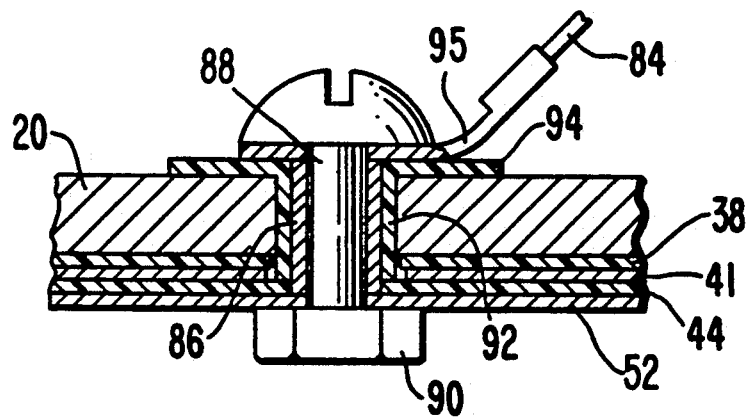
FIG. 5 is a view of a connection between the rectifier and a wire to the DC field of the main generator taken along line 5—5 of FIG. 2.

FIGS. 2 and 5 show a similar connection between the DC field of the main generator and the rectifier eyelet terminal 95 including wire 84. The conductive bushing in the form of a sleeve 86 surrounds screw 88 which is held in place by nut 90. The insulating bushing 92 has a flange 94. Sleeve 86 of conductive material is electrically connected to the layer segment 52 as shown in FIG. 2 which connects the anode surfaces of diode chips 46, 48, 50 to the negative DC terminal. A similar structure may be used for the positive DC terminal.

The clamping force necessary for the electrical current circuits and for hydraulic sealing is provided by the screws two of which are illustrated as 70 and 88 which may be threaded into the respective conductive layer or alternatively into nuts 72 and 90 as illustrated, which can be attached to the conductors by brazing, soldering or other suitable means. Insulating bushings 76 and 92 together with their respective flanges 78 and 94 provide sealing to prevent a fluid such as oil which is used as a coolant in rotor shaft 20 from leaking out. The insulating bushings 76 and 92 and flanges 78 and 94 also prevent the passage of electric current from the conductive bushings 74 and 86 or eyelet terminals 95 and 80 into the hollow rotor shaft 20. The sleeves forming the conductive bushings 74 (shown in FIG. 4) are connected to segmented portions 40, 41, 42 of the first conductive layer with each phase lead 82 connected to the exciter armature with two diode fusion chips connected to each segment, 40, 41, 42 in opposite polarity to be part of a rectifier bridge circuit as is conventional in this type of generator and shown for example in FIG. 2 of U.S. Pat. No. 4,329,603 issued May 11, 1982. The remaining opposite sides of the two diode chips are each connected to a different one of the two DC connectors as discussed above.

By similar structures, a single phase AC voltage from the exciter may be used with a full wave bridge rectifier to supply the DC voltage for the rotating field of the main generator. By similar structures, a polyphase AC voltage from the exciter may be used with a half wave bridge rectifier to supply the DC voltage for the rotating field of the main generator. In some installations it may be desirable to reverse the AC connections and the DC connections so that the AC voltages are applied to a conductive layer on the radially inward layer of the diode assembly 24. The same diode assembly may be used where the dynamo is electrically energized to be used as a starter motor.

The rectifier assembly may be fabricated as a subassembly using the insulation sleeve 38 as an outer element and which, if desired, may serve as a support. The subassembly may thereafter be slipped into the exciter region 21 of the hollow rotor shaft 20 to the position illustrated in FIG. 1. The terminals as shown in FIGS. 2 and 4 and 5 may thereafter be installed.

All equivalents which fall within the scope of the appended claims are intended to be covered thereby.

I claim:

1. A brushless self-excited cooled dynamo electric machine comprising:
    a main dynamo unit with a rotating DC field producing structure mounted on a hollow shaft, said unit being energized by an exciter dynamo unit having a rotor mounted on the hollow shaft and producing an alternating current;
    means for supplying a coolant to the interior of said hollow shaft;
    means for rectifying the alternating current to a direct current for supplying current to said DC field comprising a diode assembly including a first annular insulation layer positioned adjacent an internal peripheral surface of the hollow shaft, a first layer of conductive material composed of at least two electrically isolated segments supported by said first insulation layer, a second annular layer of insulation material concentric and supported by said first layer of conducting material which contains openings at spaced locations, a plurality of diodes positioned in the openings of said second layer of insulation material, said diodes each having a cathode surface and an anode surface with some of the diodes having a cathode surface in contact with said first conductive layer and others of said diodes having an anode surface in contact with said first conductive layer, a second layer of conductive material composed of two segments, one segment contacting exposed anode surfaces and one segment contacting exposed cathode surfaces of said diodes whereby stress due to centrifugal force tends to hold the layers together and compress diode chips to reduce the likelihood of diode breakage; and wherein
    said layers are mounted as concentric laminates extending around a periphery of an inner wall of said hollow shaft.

2. A machine as defined in claim 1, wherein there are two segments in said first conductive layer, the alternating current is single phase, and the rectifier means is a full wave rectifier.

3. A machine as defined in claim 1, wherein there are three segments in said first conductive layer, the alternating current is three phase, and the rectifier means is a full wave rectifier.

4. A machine as defined in claim 1, wherein there are three segments in said first conductive layer, the alternating current is three phase and the rectifier means is a half wave rectifier.

5. A machine as defined in claim 1 further comprising a plurality of alternating current terminal leads each connected to a separate one of said first conductive material layer segments, a negative terminal lead connected to one of said segments of conductive material in said second conductive layer and a positive terminal lead connected to another of said segments of conductive material in said second conductive layer.

6. A machine as defined in claim 5 wherein the conductive material forming the positive and negative terminal leads includes non-intersecting strips of conductive material that extend in a circumferential direction relative to walls of the hollow shaft and include axially extending tabs which engage exposed diode surfaces.

7. A machine as defined in claim 1 further having electrical connections through the hollow shaft wall which include fasteners that are hydraulically sealed with respect to and electrically insulated from the hollow shaft wall.

8. A machine as defined in claim 7, wherein one of said connections includes a fastener having a body with a threaded end portion and a retaining nut on the threaded end portion, said body being surrounded by a tubular layer of conductive material which contacts a one of said layers of conductive material, and there being a tubular layer of insulating material surrounding said tubular layer of conductive material and having a member with an enlarged diameter at a radially outer end to electrically isolate the tubular layer of conductive material, the fastener, and a lead terminal from the hollow shaft wall.

9. A machine as defined in claim 8 wherein the first conductive layer comprises three segments each having an electrical terminal connection to different terminals of a three phase winding on the rotor of said exciter and the second conductive layer with two segments each having an electrical terminal connection serving as positive and negative connections from said rectifier means to the rotor of said main generator.

10. A machine as defined in claim 1 which is powered mechanically and serves as an electric generator.

11. A machine as defined in claim 1 which is supplied with electrical power and serves as a motor.

12. A diode assembly mounted on a hollow cylindrical housing of electrical insulation material surrounding a plurality of diodes that are connected as a rectifier for producing direct current from an alternating current comprising:

a first annular layer of insulation material adjacent an inner peripheral surface of said hollow housing supported by said first layer of conductive material;

a first layer of conductive material composed of a plurality of electrically isolated segments supported by said first layer of insulation material;

a second annular layer of insulation material fitting within the hollow cylindrical housing and supported by said first layer of conductive material and containing a plurality of spaces in which said diodes are located;

a second layer of conductive material composed of a pair of electrically isolated segments supported by said second layer of insulation material; and aligned apertures in said layers and said housing receiving fasteners of electrically conducting material which are electrically connected to terminals of said diodes which are respectively connected to an anode on the one surface of at least one diode and a cathode on the other surface of at least one diode; and wherein said layers being mounted as laminates extending around a periphery of an inner wall of said hollow housing.

13. A diode assembly as defined in claim 12 wherein one of said surfaces is in supporting engagement with each of said first layer segments and the other of said surfaces is electrically connected with one or the other of said pair of second layer segments.

14. A diode assembly as defined in claim 12 wherein the hollow cylindrical housing is mounted in a hollow rotor of a dynamo electric machine with the fasteners of electrically conducting material inserted in apertures through said rotor which are in alignment with said aligned apertures, said dynamo electric machine comprising a main dynamo unit with a rotating DC field producing structure mounted on a hollow shaft connected to a coolant source, the main unit being energized by an exciter dynamo unit having a rotor mounted on the same hollow shaft and being adapted to produce an alternating current.

15. A brushless self-exciter cooled dynamo electric machine comprising:

a main dynamo unit with a rotating DC field producing structure mounted on a hollow shaft connected to a coolant source, said main unit being energized by an exciter dynamo unit having a rotor mounted on the same hollow shaft for producing an alternating current; and means for rectifying the alternating current to a direct current for supplying current to said DC field including a diode assembly composed of a first annular insulation layer adjacent an inner peripheral surface of said hollow shaft, a first layer of conductive material composed of a plurality of electrically isolated segments supported by said first insulation layer, a second annular layer of insulation material concentric to and supported by said first layer of conductive material which contains a plurality of spaces, a second layer of conductive material composed of a pair of electrically isolated segments supported by said second layer of insulation material, said layers being mounted as concentric laminates extending around a periphery of an inner wall of said hollow shaft and a plurality of diodes in heat conducting relationship to the hollow shaft and to coolant flowing in said hollow shaft and having two surfaces with an anode on one surface and a cathode on the other surface, each diode being located in the spaces of said second insulation layer with one of said diode surfaces being in supporting engagement with one of the first layer segments and the other of said diode surfaces being in supporting engagement with one or the other of said pair of second layer segments so that the diodes are stressed only in compression by centrifugal forces due to rotor rotation.

16. A machine as defined in claim 15 further comprising:

AC terminals connected to at least two segments of one of said first and second conductive layers; and DC terminals respectively connected to two segments of the other of said first and second conductive layers.

17. A machine as defined in claim 15 further comprising:

AC terminals connected to three segments of said first conductive layer; and

DC terminals connected to two segments of the second conductive layer.

18. A brushless self-excited oil cooled dynamo electric machine comprising:

a main dynamo unit with a rotor producing a DC field mounted on a hollow shaft connected to a coolant source, said main dynamo unit being energized by an exciter dynamo unit having a rotor mounted on the hollow shaft and producing an alternating current;

means for rectifying the alternating current to a direct current for supplying current to said DC field including a rectifier package mounted in heat conducting relation and concentrically on an interior surface of said hollow shaft to be in a heat conducting relationship with coolant from said coolant source having a pair of concentric annular layers of insulating material separated by a layer of conducting material divided into segments for receiving AC current from said exciter unit rotor, said layers being mounted as laminates extending around a periphery of an inner wall of said hollow shaft, a plurality of diodes each having a cathode surface and an anode surface mounted with one of said surfaces in engagement with said layer of conducting material and the other of said surfaces in engagement with conductive segments connected to DC output terminals that are connected to said DC field; and a drive shaft for supplying driving torque to said dynamo unit rotors positioned concentrically of said hollow shaft and interiorly of said rectifier package.

19. A brushless self-excited oil cooled dynamo electric machine comprising:

a main dynamo unit with a rotor producing a DC field mounted on a hollow shaft connected to a coolant source, said main dynamo unit being energized by an exciter dynamo unit having a rotor mounted on the hollow shaft and producing an alternating current;

means for rectifying the alternating current to a direct current for supplying current to said DC field including a rectifier package mounted in heat conducting relation and concentrically on an interior surface of said hollow shaft to be in a heat conducting relationship with coolant from said coolant source having a pair of concentric annular layers of insulating material separated by a layer of conducting material divided into segments for receiving AC current from said exciter unit rotor, said layers being mounted as laminates extending around the periphery of the inner wall of said hollow shaft, a plurality of diodes each having a cathode surface and an anode surface mounted with one of said surfaces in engagement with said layer of conducting material and the other of said surfaces exposed, and DC output terminals that are connected by means including a jumper to said exposed surfaces and to said DC field; and a drive shaft for supplying driving torque to said dynamo unit rotors positioned concentrically of said hollow shaft and interiorly of said rectifier package.

* * * * *